(12) United States Patent
Huang et al.

(10) Patent No.: US 8,451,874 B2
(45) Date of Patent: May 28, 2013

(54) VERY LARGE MODE SLAB-COUPLED OPTICAL WAVEGUIDE LASER AND AMPLIFIER

(75) Inventors: Robin K. Huang, N. Billerica, MA (US); Joseph P. Donnelly, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 242 days.

(21) Appl. No.: 12/629,613

(22) Filed: Dec. 2, 2009

(65) Prior Publication Data

US 2011/0150010 A1     Jun. 23, 2011

(51) Int. Cl.
*H01S 5/00* (2006.01)

(52) U.S. Cl.
USPC .................. 372/43.01; 372/44.01; 372/45.01; 372/46.016; 372/50.1

(58) Field of Classification Search .............. 372/43.01, 372/44.1, 45.01, 46.014, 50.1
See application file for complete search history.

(56) References Cited

U.S. PATENT DOCUMENTS

| | | | |
|---|---|---|---|
| 4,689,797 A | 8/1987 | Olshansky | |
| 4,942,585 A | 7/1990 | Ungar | |
| 5,022,036 A * | 6/1991 | Suyama et al. | 372/45.01 |
| 5,048,907 A * | 9/1991 | Wickman et al. | 385/2 |
| 5,197,077 A | 3/1993 | Harding et al. | |
| 5,272,711 A | 12/1993 | Mawst et al. | |
| 5,369,658 A | 11/1994 | Ikawa et al. | |
| 5,376,582 A | 12/1994 | Behfar-Rad et al. | |
| 5,594,749 A | 1/1997 | Behfar-Rad et al. | |
| 6,171,876 B1 * | 1/2001 | Yuang et al. | 438/22 |
| 6,171,878 B1 * | 1/2001 | Fujimoto et al. | 438/46 |

(Continued)

FOREIGN PATENT DOCUMENTS

| | | |
|---|---|---|
| JP | 58115878 | 7/1983 |
| JP | 59218786 | 12/1984 |

(Continued)

OTHER PUBLICATIONS

Joseph P. Donnelly et al. "AlGaAs-InGaAs Slab-Coupled Optical Waveguide Lasers" IEEE Journal of Quantum Electronics, Vol. 39, No. 2, Feb. 2003, pp. 289-298.*

(Continued)

*Primary Examiner* — Jessica Stultz
*Assistant Examiner* — Delma R Forde
(74) *Attorney, Agent, or Firm* — Gesmer Updegrove LLP

(57) ABSTRACT

A very large mode (VLM) slab-coupled optical waveguide laser (SCOWL) is provided that includes an upper waveguide region as part of the waveguide for guiding the laser mode. The upper waveguide region is positioned in the interior regions of the VLM SCOWL. A lower waveguide region also is part of the waveguide that guides the laser mode. The lower waveguide region is positioned in an area underneath the upper waveguide region. An active region is positioned between the upper waveguide region and the lower waveguide region. The active region is arranged so etching into the VLM SCOWL is permitted to define one or more ridge structures leaving the active region unetched. One or more mode control barrier layers are positioned between said upper waveguide region and said lower waveguide region. The one or more mode control barrier layers control the fundamental mode profile and prevent mode collapse of the laser mode. The mode control barrier layers also block carrier leakage from the active region. These layers are essential to obtaining VLM SCOWLs.

24 Claims, 5 Drawing Sheets

U.S. PATENT DOCUMENTS

| | | | |
|---|---|---|---|
| 6,256,330 | B1 | 7/2001 | LaComb |
| 6,400,742 | B1* | 6/2002 | Hatakoshi et al. .......... 372/46.01 |
| 6,432,735 | B1* | 8/2002 | Cho et al. ........................ 438/31 |
| 6,914,922 | B2* | 7/2005 | Hayashi et al. ............. 372/45.01 |
| 6,928,223 | B2* | 8/2005 | Walpole et al. ................ 385/131 |
| 7,027,475 | B1 | 4/2006 | Zediker et al. |
| 7,106,773 | B1* | 9/2006 | Walpole et al. ............. 372/45.01 |
| 7,199,398 | B2* | 4/2007 | Ono et al. ........................ 257/66 |
| 7,333,523 | B2* | 2/2008 | Tanaka et al. ............... 372/45.01 |
| 7,606,278 | B2* | 10/2009 | Kuramoto .................. 372/45.01 |
| 7,609,739 | B2* | 10/2009 | Tanaka ....................... 372/45.01 |
| 7,804,869 | B2* | 9/2010 | Freund ...................... 372/45.012 |
| 8,073,031 | B2* | 12/2011 | Tan et al. .................... 372/46.01 |
| 2001/0033591 | A1 | 10/2001 | Fukunaga et al. |
| 2002/0024984 | A1* | 2/2002 | Ohkubo et al. ................. 372/46 |
| 2003/0017662 | A1 | 1/2003 | Cho et al. |
| 2003/0063644 | A1* | 4/2003 | Fukunaga ....................... 372/46 |
| 2004/0208213 | A1 | 10/2004 | Lichtenstein et al. |
| 2005/0163172 | A1 | 7/2005 | Sacher et al. |
| 2005/0201439 | A1* | 9/2005 | Horie ......................... 372/43.01 |
| 2006/0045157 | A1* | 3/2006 | Ratowsky et al. .......... 372/46.01 |
| 2006/0109881 | A1* | 5/2006 | Kwak et al. ................ 372/43.01 |
| 2006/0193353 | A1 | 8/2006 | Kim et al. |
| 2008/0137701 | A1* | 6/2008 | Freund ...................... 372/45.011 |
| 2008/0240188 | A1* | 10/2008 | Ohmi et al. ................. 372/43.01 |
| 2009/0116525 | A1 | 5/2009 | Shchukin et al. |
| 2011/0128982 | A1* | 6/2011 | Huang et al. ............... 372/45.01 |
| 2011/0261853 | A1* | 10/2011 | Kajitani et al. ............. 372/45.01 |

FOREIGN PATENT DOCUMENTS

| | | |
|---|---|---|
| JP | 2000022261 A | 1/2000 |
| WO | 0206866 A2 | 1/2002 |
| WO | 2008114896 | 9/2008 |

OTHER PUBLICATIONS

Jason J. Plant, et al. "250 mW, 1.5 m monolithic passively mode-locked slab-coupled optical waveguide laser" Jan. 15, 2006 / vol. 31, No. 2 / Optics Letters, pp. 223-225.*

Robin K. Huang et. al. "Coherent combination of slab-coupled optical waveguide lasers" Society of Photo-optical Instrumentation Engineers, Mar. 19, 2010 pp. 1-13.*

Robin K. Huang, et. al. "Slab-Coupled Optical Waveguide Lasers Emerge from a Multimode Sea by filtering out a multitude of high-order modes, these novel semiconductor lasers emit a large single-mode beam". Photonics.com, Oct. 1, 2006, pp. 1-6.*

Robin K. Huang et. al. "High-Brightness Slab-Coupled Optical Waveguide Laser Arrays" IEEE Photonics Technology Letters, Vol. 17, No. 5, May 2005, pp. 959-961.*

BATOP—refractive index of AlGaAs, http://www.batop.de/information/n_AlGaAs.html Dec. 11, 2011, pp. 1-4.* http://refractiveindex.info/?group=CRYSTALS&material=AlGaAs, Dec. 11, 2011 pp. 1-2.* http://refractiveindex.info/?group=CRYSTALS&material=AlGaAs Dec. 11, 2011, pp. 1-2.*

International Search Report and Written Opinion mailed on Aug. 25, 2011 for International Application PCT/US2010/056775 filed on Nov. 16, 2010.

Connolly et al., NASA Contractor Report, 4238,"High-Power Single Spatial mode AlGaAs Channeled-Substrate-Planar Semiconductor Diode Lasers for Spaceborne Communications", 1989.

Wenzel et al., "Fundamental-Lateral Mode Stabilized High-Power Ridge-Waveguide Lasers with a Low Beam Divergence" IEEE Photonics Technology Letters, vol. 20, No. 3, Feb. 1, 2008.

Botez et al., "Terraced-heterostructure large-optical-cavity AlGaAs diode laser" A new type of high-power cw single-mode device 1982 American Institute of Physics.

Butler et al., "Spatial mode discrimination and control in high-power single-mode constricted double-heterojunction large-optical-cavity diode lasers" Appl. Physics Letters, Dec. 15, 1982.

Butler et al., "Lateral Mode Discrimination and Control in High-Power Single-Mode Diode Lasers a~of the Large-Optical-Cavity (LOC) Type" 1984, IEEE Journal of Quantum Electronics, vol. QE-20, No. 8.

Crump et al., "Multiple vertical mode high power 975nm diode lasers restricted to single vertical mode operation through use of optical facet coatings" Electronics Letters, Jan. 1, 2009, vol. 45, No. 1.

Popovichev et al., "High-power single-transverse-mode ridge optical waveguide semiconductor lasers" Quantum Electronics, 2002.

Jones et al., "Near-diffraction-limited power (~1W) single longitudinal mode CW diode laser tunable from 960 to 980 nm" Electronics Letters Sep. 14, 1995, vol. 31, No. 19.

Maiorov et al., "High Power InGaAsP/InP Broad-Waveguide Single-Mode Ridge-Waveguide Lasers" 2000 Optical Society of America.

Osowski et al., "High-power, single-mode, eye-safe wavelength semiconductor lasers" 2008 SPIE, vol. 7114.

Al-Muhanna et al., "14.3 W quasicontinuous wave front-facet power from broad-waveguide Al-free 970nm diode lasers" 1997 American Institute of Physics.

Hi-Tech Report, Sharp Develops Single-Transverse-Mode High-Power Laser Diode, JEE, Nov. 1990.

Chan et al., "Designs for High Power, Single Mode Operation in Broad Stripe Semiconductor Lasers" SPIE vol. 893, High Power Lasers Diodes and Applications, 1988.

Bettiati et al., "High Brightness Single-Mode 1060-nm Diode Lasers for Demanding Industrial Applications" Lasers and Electro-Optics, 2007 and the International Quantum Electronics Conference, published Jun. 2007.

Mawst, "High-Power, Single-Mode Antiresonant Reflecting Optical Waveguide-type Diode Lasers" Conference: Laser Diodes and Applications, Feb. 1995.

Mawst, "High-power narrow-beam single-mode ARROW-type semiconductor diode lasers" 1996 SPIE The International Society for Optical Engineering, Jan. 1996.

Dutta et al., "Single-mode high-power lasers emitting at 980nm" Feb. 1995.

Chida, "High-power Single-transverse-mode Operation of Narrow-ridge-waveguide 0.98-um InGaAs/AlGaAs strained-quantum-well Lasers by in situ Monitored RIBE" International Laser conference 1994.

* cited by examiner

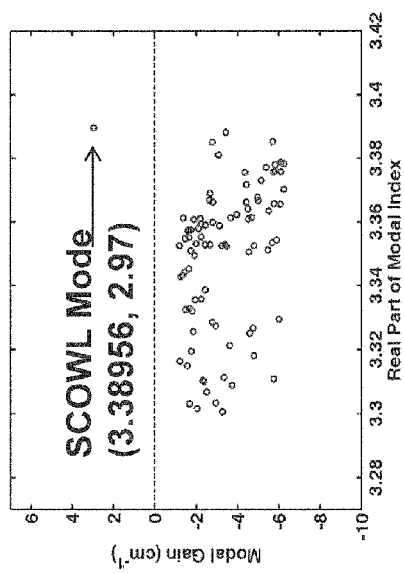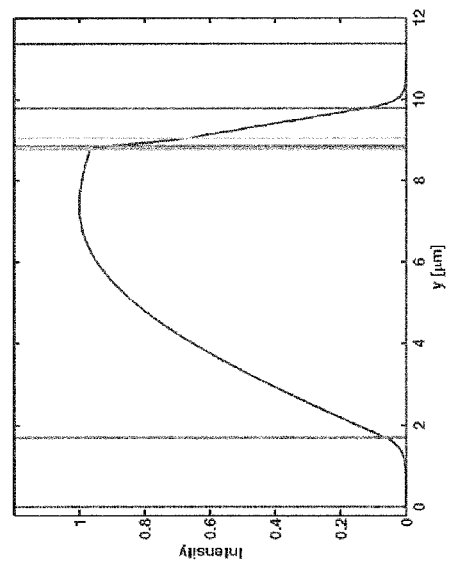
FIG. 3A
FIG. 3B

VERY LARGE MODE SLAB-COUPLED OPTICAL WAVEGUIDE LASER AND AMPLIFIER

SPONSORSHIP INFORMATION

This invention was made with government support awarded by DARPA/MTO under Grant No. FA8721-05-C-0002. The government has certain rights in the invention.

BACKGROUND OF THE INVENTION

The invention is related to the field of slab-coupled optical waveguide lasers (SCOWL), and in particular to a very large mode SCOWL.

High power, single spatial mode diode lasers are important for a number of applications, including pumps for fiber lasers and amplifiers and free space optical communications. The power in a single mode is limited by the size of the single-spatial mode in the diode laser.

The state of the art in large spatial mode diode lasers is the SCOWL. A SCOWL device lasing at a wavelength of 1.0 µm designed with a waveguide thickness of 5 µm has been demonstrated to have a stable single spatial mode with dimensions of 5.7 µm (horizontal direction) by 4.5 µm (vertical direction), where these dimensions are given as full width at $1/e^2$ intensity. The maximum continuous wave (CW) output power from this device is approximately 2 W.

If one is able to increase the single spatial mode size, then the power should approximately scale with area. This is because the maximum power density at the facet is approximately constant, and is limited by effects such as catastrophic optical damage and thermal roll-over. As the mode area at the facet is increased, the absolute power level at the facet should approximately scale with the mode area.

A simple approach to increasing the mode size that is used with the SCOWL is scaling the waveguide height and ridge width dimensions while maintaining the ratios of T/H and T/W (where T, H, and W are the waveguide height in the slab region, the waveguide height in the ridge region, and the ridge width, respectively) according to the single-mode criteria. However, with this simple approach, one finds that it is extremely difficult to filter out higher order modes, since the higher order modes become more numerous as the waveguide dimensions increase and the propagation constants of the higher order modes also become more closely spaced. In addition, it becomes more difficult to provide sufficient gain to the fundamental mode, while controlling its mode profile. Mode collapse of the fundamental mode (i.e., peaking of the fundamental mode around the active region) can easily occur in such a structure due to strong index guiding in the active region. The core of this invention is the use of additional mode control barrier layers adjacent to the active region to control the vertical profile of the fundamental laser mode and prevent mode collapse.

SUMMARY OF THE INVENTION

According to one aspect of the invention, there is provided very large mode (VLM) slab-coupled optical waveguide laser (SCOWL). The VLM SCOWL includes an upper waveguide region to help guide the laser mode. The upper waveguide region is positioned in the interior regions of the VLM SCOWL. A lower waveguide region also helps to guide the laser mode. The lower waveguide region is positioned in an area underneath the upper waveguide region. An active region is positioned between the upper waveguide region and the lower waveguide region. The active region is arranged so etching into the VLM SCOWL is permitted to define one or more ridge structures leaving the active region unetched. One or more mode control barrier layers are positioned adjacent to the said active region. The one or more mode control barrier layers are used to control the profile of the fundamental mode and prevent mode collapse of the laser mode. They also can be used to block carrier leakage from the active region.

According to another aspect of the invention, there is provided a very large mode (VLM) slab-coupled optical waveguide laser (SCOWL). The method includes forming an upper waveguide region as part of the waveguide for guiding a laser mode. The upper waveguide region is positioned in the interior regions of the VLM SCOWL. Also, the method includes forming a lower waveguide region as part of the waveguide for guiding the laser mode. The lower waveguide region is positioned in an area underneath the upper waveguide region. Moreover, the method includes positioning an active region between the upper waveguide region and the lower waveguide region. In addition, the method includes arranging the active region so etching into the VLM SCOWL is permitted to define one or more ridge structures leaving the active region unetched. Furthermore, the method includes positioning one or more mode control barrier layers adjacent to the said active region. The one or more mode control barrier layers control the profile of the fundamental mode, prevent mode collapse of the laser mode, and block carrier leakage from the active region.

BRIEF DESCRIPTION OF THE DRAWINGS

FIGS. 3A-3B are graphs illustrating the operational characteristics of a 1060 nm VLM SCOWL formed in accordance with the invention;

DETAILED DESCRIPTION OF THE INVENTION

The invention provides a novel design for a VLM SCOWL to increase its single spatial mode output power. Increasing the output power of the SCOWL is accomplished by an increase of the optical mode size of the fundamental SCOWL mode.

Figure 1:
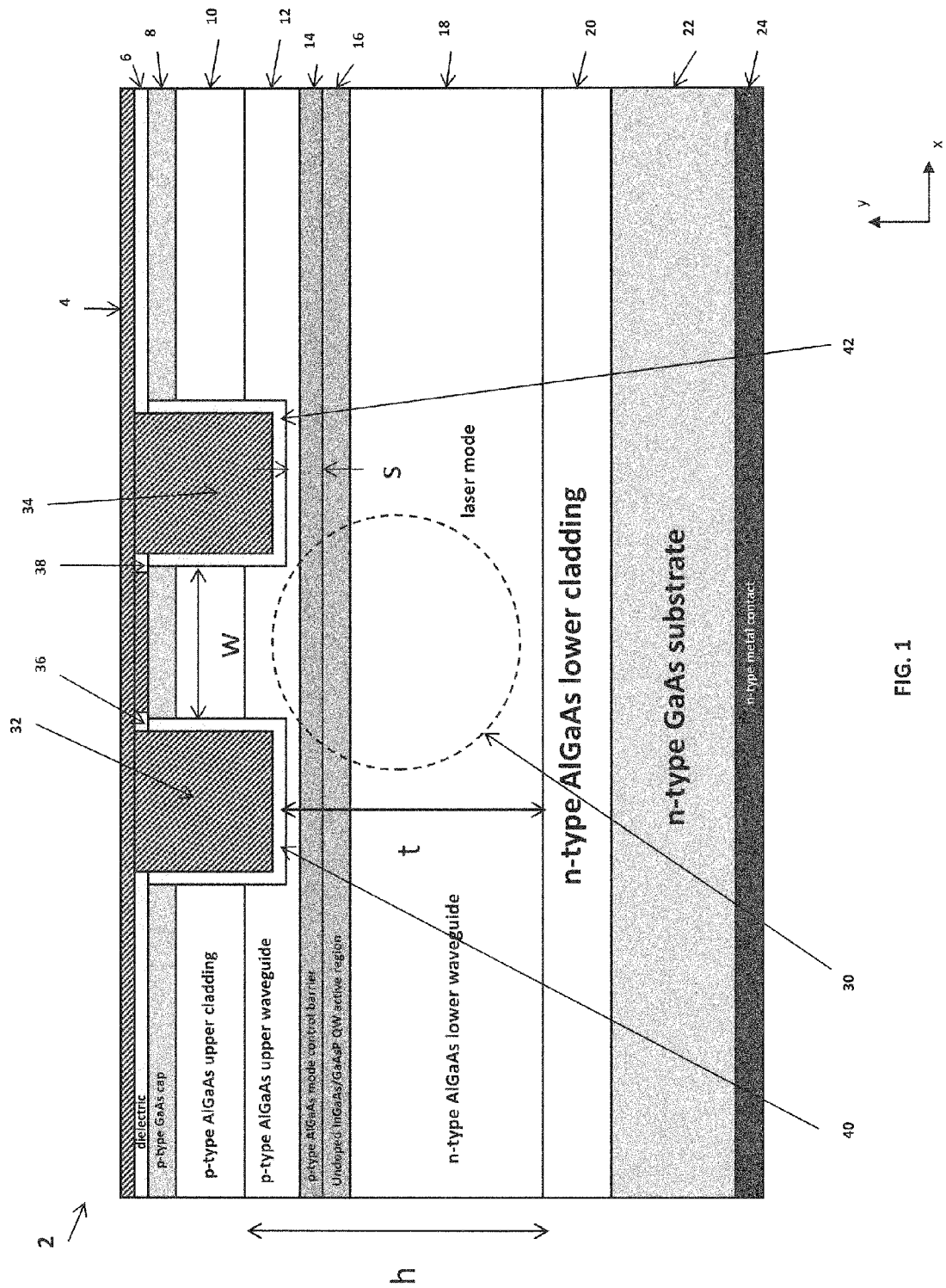
FIG. 1 is a schematic diagram illustrating a VLM SCOWL formed in accordance of the invention.

FIG. 1 shows a cross-sectional view of a VLM SCOWL 2 formed in accordance of the invention. The VLM SCOWL 2 includes a p-type metal layer 4 positioned on a dielectric layer being 6. The dielectric layer 6 is positioned on a p-type GaAs cap layer 8. The VLM SCOWL 2 also includes a p-type upper cladding layer 10 where the p-type GaAs cap layer 8 is positioned on. The p-type upper cladding layer 10 is formed on a p-type AlGaAs upper waveguide region 12. A p-type mode control barrier layer 14 is positioned between the p-type upper waveguide region 12 and an undoped active region 16. The undoped active region 16 is placed on an n-type lower waveguide region 18. The n-type lower waveguide region 18 is positioned on an n-type lower cladding layer 20.

The n-type lower cladding layer 20 is positioned on an n-type GaAs substrate 22, where the GaAs substrate 22 is positioned on an n-type metal layer 24. A number of trench structures 32, 34 are formed in regions that include the dielectric layer 6, p-type GaAs cap layer 8, p-type upper cladding layer 10, and p-type upper waveguide region 12. In addition, the trench structures 32, 34 are lined with dielectric layers 40, 42. The content within the trench structures 32, 34 include the same materials that define the p-type metal layer 4 to form ridge waveguide structures. Alternatively, the trench structures 32, 34 can be filled with primarily with air and a metal lining. The dielectric layers 40, 42 include the same materials that define the dielectric layer 6. The dielectric has metal contact openings 36, 38 that are formed on the ridge structure.

The p-type upper cladding layer 10 and n-type lower cladding layer 20 assist in confinement of a laser mode 30 propagating through the p-type AlGaAs upper waveguide region 12, p-type mode control barrier layer 14, active region 16, and n-type lower waveguide region 18. The p-type upper waveguide region 12 can include AlGaAs having a concentration of Al between 0% and 50% and a thickness between 0.30 µm and 2.0 µm with a doping level between $1\times10^{15}$ and $1\times10^{18}$ cm$^{-3}$. The p-type mode control barrier layer 14 can include AlGaAs having a concentration of Al between 0% and 50% and a thickness between 0.01 µm and 0.3 µm with a doping level between $1\times10^{15}$ and $1\times10^{18}$ cm$^{-3}$. The n-type lower waveguide region 18 can include AlGaAs having a concentration of Al between 0% and 50% and a thickness between 2.0 µm and 20 µm with a doping level between $1\times10^{15}$ and $1\times10^{18}$ cm$^{-3}$. The composition of the p-type upper cladding layer 10 and the n-type lower cladding layer 20 must be higher in Al percentage as compared to the p-type upper waveguide region 12 and the n-type lower waveguide region 18, respectively.

The active region 16 can include undoped quantum wells, barrier layers, and bounding sublayers. The undoped bounding sublayers in the active region 16 can include GaAsP, where the P concentration is between 0% and 30%, or AlGaAs, where the Al concentration is between 0% and 15%, with a thickness between 1 and 20 nm. The undoped barrier layers in the active region 16 can include GaAsP, where the P concentration is between 0% and 30%, or AlGaAs, where the Al concentration is between 0% and 15% Al, with a thickness between 1 and 20 nm. Moreover, the undoped quantum wells in the active region 16 can include InGaAs, where the In concentration is between 0% and 40%, with a thickness between 1 and 20 nm.

Since the active region 16 is positioned between the waveguides 12, 18, it is necessary to dope the upper waveguide region 12 p-type, while the lower waveguide region 18 (where the largest fraction of the mode 30 is positioned) is doped n-type. By positioning the p-n junction around the active region 16, proper injection of electrons and holes into the active region 16 is ensured. By using this arrangement, the active region 16 is confined within the interior regions of the waveguide of the VLM SCOWL 2. This permits etching in the VLM SCOWL 2 to form the ridge waveguides leaving the active region 16 unetched. This allows a finite amount of lateral current spreading to occur.

The p-type mode control barrier layer 14 is chosen to have an index slightly lower than the p-type upper waveguide region 12 and n-type lower waveguide region 18 (equivalently, higher Al content in AlGaAs in the mode control barrier as compared with the waveguide). The p-type mode control barrier layer 14 prevents mode collapse of the fundamental mode due to the high index in the active region 16, and aids the suppression of higher order modes. This has been confirmed by two dimensional, complex index mode solver calculations. The mode control barrier layer 14 is essential to the VLM SCOWL concept. The mode control barrier layer 14 also serves as a blocking layer for electron leakage from the active region 16.

The doping levels in both the p-type upper and n-type lower waveguide region 12, 18 are also critical, as the free carrier absorption in the waveguide dominates the waveguide loss of the mode. At the same time, there is a trade-off between waveguide loss and series resistance. Series resistance is of particular importance in a narrow-ridge device like the SCOWL because it limits the electrical-to-optical efficiency at high drive current levels.

Also, it is important that specific lengths s, w, h within the VLM SCOWL 2 be obtained so optimal performance can be adhered to. The length w, which defines the ridge width and corresponds to the distance between the trench structures 26, 28, can be between 2 µm and 30 µm. The length s, defines the critical distance between the final etch depth of the etched trenches 32, 34, and the active region 16, can be between 0 and 1 µm. The length h (waveguide height), defines the combined height of the upper waveguide region 12, p-type mode control barrier layer 14, active region 16, and lower waveguide region 18, can be between 2.3 µm and 23 µm. The overall VLM SCOWL 2 cavity length can be between 0.2 mm and 40 mm.

Also, the SCOWL 2 includes an optical operational frequency range of 600 to 1200 nm for GaAs-based SCOWL structures, which includes preferred optical frequencies of 980 nm and 1060 nm.

For 980-nm and 1060-nm VLM SCOWL devices formed in accordance with the invention, one can design a number of VLM SCOWL structures with waveguide thicknesses of 8 to 12 µm. These structures appear to be very robust in filtering higher order modes. Design criteria for these AlGaAs-based VLM SCOWLs include not etching through the active region; the T/H ratio is less than or equal to 0.90; the confinement factor should be approximately 0.003 to 0.005. To provide sufficient gain to the fundamental mode, the number of quantum wells (QWs) in the active region 16 scales with the waveguide thickness h. For example, two QWs are needed for waveguides 6-7 µm in thickness; 3 QWs are needed for 8-10 µm waveguide thickness; and 4 QWs are needed for 10-12 µm waveguide thickness. Since the QWs consist of compressively strained InGaAs, tensile-strained GaAsP is used in the active region 16 bounding and barrier layers to strain-balance the structure.

Figure 2A:
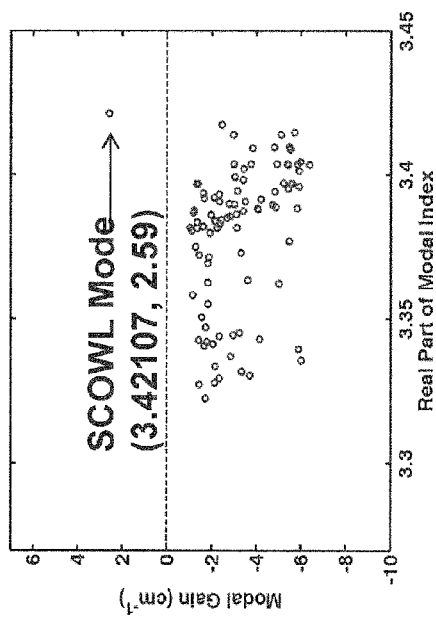
FIGS. 2A-2B are graphs illustrating the operational characteristics of a 980 nm VLM SCOWL formed in accordance with the invention.
Figure 2B:
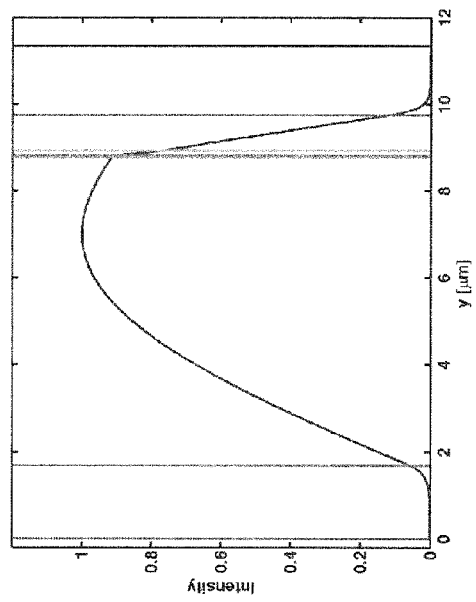

FIG. 2A is a graph illustrating modal gain versus modal index for a 980 nm VLM SCOWL formed in accordance with the invention. In this case, the SCOWL has a length s value −0.02 µm and a waveguide thickness h of 8 µm. Positive values of gain indicate net gain, negative values indicate loss. Note only the lowest-order VLM SCOWL mode (i.e., the mode with the highest modal index) has gain. FIG. 2B is a graph illustrating the mode profile of the 980 nm VLM SCOWL. According to simulations, it is possible to increase the waveguide height in the ridge up to at least 12 µm in thickness while maintaining single mode operation of the VLM SCOWL.

FIG. 3A is graph illustrating modal gain versus modal index for a 1060 nm VLM SCOWL faulted in accordance with the invention. In this case, the VLM SCOWL has a length s value of 0.02 µm and a waveguide thickness h of 8 µm. Positive values of gain indicate net gain, negative values indicate loss. Note that only the lowest-order VLM SCOWL mode (i.e., the mode with the highest modal index) has gain. FIG. 3B is a graph illustrating the mode profile of the 1060 nm VLM SCOWL. According to simulations, it is possible to increase the waveguide height in the ridge up to at least 12 µm in thickness while maintaining single mode operation of the VLM SCOWL as well. Even thicker waveguides should be possible.

Figure 4:
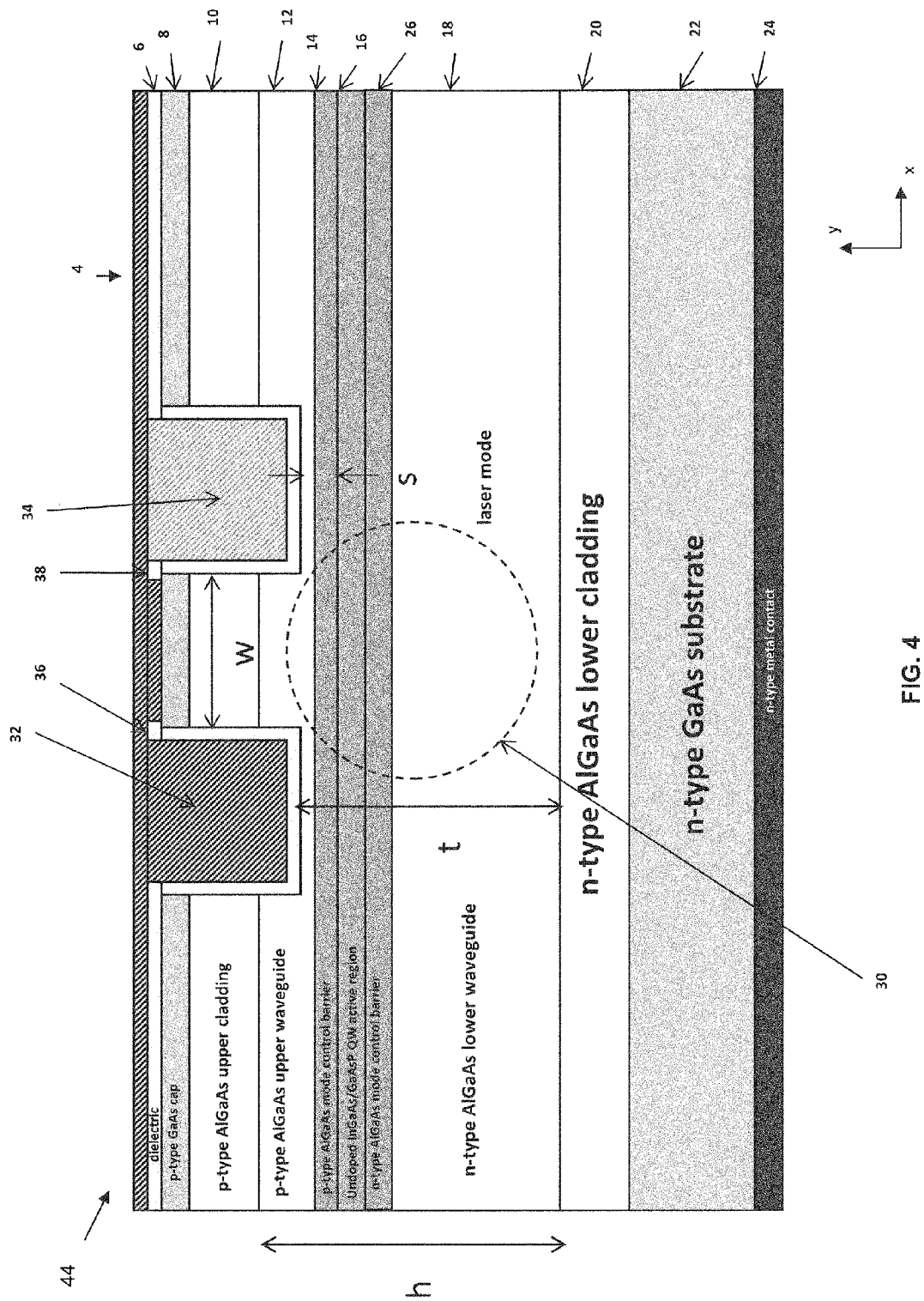
FIG. 4 is a schematic diagram illustrating an alternative embodiment of the invention.

FIG. 4 is an alternative embodiment of the invention. Note the VLM SCOWL 44 of FIG. 4 is substantially similar to the VLM SCOWL 2 of FIG. 1. The difference is the additional n-type mode control barrier layer 26 positioned between the undoped active region 16 and n-type lower waveguide region 18. By arranging two mode control barrier layers 14, 26 above and below the undoped active region 16, the VLM SCOWL 44 allows for lasing operations that require very thick waveguides and hence very large mode sizes. The VLM SCOWL 44 provides more design flexibility as compared with VLM SCOWL 2. The n-type mode control barrier layer 26 serves as an additional blocking layer for carrier leakage from the active region 16. The addition of the n-type mode control barrier layer 26 also further prevents mode collapse of the fundamental mode due to index guiding, and further aids the suppression of higher order modes. The n-type mode control barrier layer 26 can include AlGaAs having a concentration of Al between 0% and 50% and a thickness between 0.01 µm and 0.3 µm with a doping level between $1\times10^{15}$ and $1\times10^{18}$ cm$^{-3}$. The VLM SCOWL 44 follows the same design principles as described for VLM SCOWL 2, such as the limitations of the lengths s, h, w and the composition and properties of the active region 16. Also, the VLM SCOWL 44 includes an optical operational frequency range of 600-1200 nm, which includes preferred frequencies of 980 nm and 1060 nm.

Figure 5A:
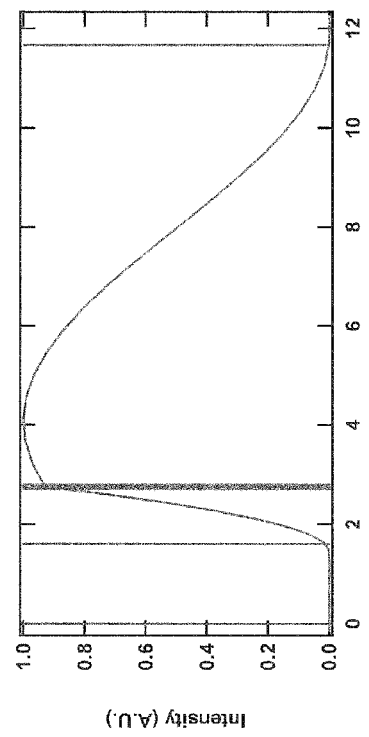
FIGS. 5A-5B are graphs illustrating the operational characteristics of a 1060 nm VLM SCOWL of FIG. 4.
Figure 5B:
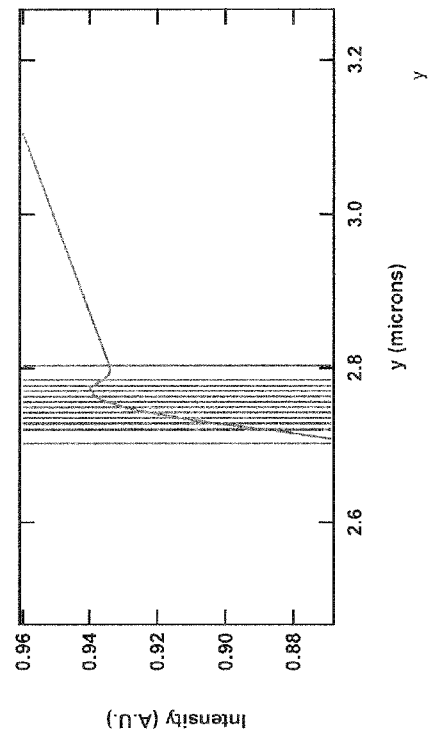

FIG. 5A is graph illustrating the modal profile for a 1060 nm VLM SCOWL of FIG. 4. In this case, the VLM SCOWL has a mode control barrier layer above and below the active region and a length s value of 0.02 µM and a thickness of 10 µm. According to simulations, it is possible to increase the waveguide height in the ridge up to at least 12 µm in thickness while maintaining single mode operation of the VLM SCOWL as well. Even thicker waveguides should be possible. FIG. 5B is a graph illustrating an expanded VLM SCOWL mode profile around the multiple quantum well active region. This shows strong confinement in the active region.

The inventive VLM SCOWL is a substantial improvement over both previous SCOWL devices and also many other types of single-mode semiconductor lasers. For the 10 µm thick waveguide, with a waveguide that is twice as thick as the state of the art SCOWL device mentioned earlier, the expected increase in mode area is approximately a factor of four (4). Therefore, it is expected that the single spatial mode power will increase by approximately a factor of four as well, from 2 W up to 8 W. Thermal effects under CW operation, however, will play a role to limit the single mode, kink-free power level. One might expect that the inventive VLM SCOWL will reach multi-watt operation, at the 5 W level and higher. This power level is a factor of two to three higher than the current state of the art in any single spatial mode diode laser, including SCOWLs and ridge waveguide lasers. The inventive VLM SCOWL should also improve the peak power available for pulsed laser applications, such as direct diode lasers for use in free space optical communications.

The VLM SCOWL described so far is implemented in the InGaAs/AlGaAs/GaAs material system. It is possible to design and implement the VLM SCOWL in other material systems and other wavelengths that are commonly used for semiconductor lasers and amplifiers, including, but not limited to, InGaAsP/GaAs, InGaAsP/InP, InGaAsSb/AlGaAsSb/GaSb, and InGaN/AlGaN/GaN.

The inventive VLM SCOWL, when used in arrays, is expected to be useful for pumping high power ytterbium-doped fiber lasers. With wavelength beam combining (e.g., in an external cavity), dense SCOWL arrays can in principle enable collimated, high brightness beams with scalable output power, useful for a variety of applications. The amplifier version of this device could be used in high power phase-locked or coherently combined arrays in a seeded-injection amplifier approach, perhaps enabling kW-class diffraction-limited diode laser sources.

Any of the above-discussed embodiments of very large mode SCOWL devices and arrays may be incorporated into an associated laser system. Such a laser system may include, for example, the very large mode SCOWL devices, the beam combining cavity, electrical, thermal, mechanical, electro-optical and opto-mechanical laser control equipment, associated software and/or firmware, and an optical power delivery subsystem. Embodiments of the very large mode SCOWL and associated laser systems, can be used in applications that benefit from the high power and brightness of the embodied laser source produced using the very large mode SCOWL devices. These applications may include, for example, materials processing, such as welding, drilling, cutting, annealing and brazing; marking; laser pumping; medical applications; and directed energy applications. In many of these applications, the laser source formed by the very large mode SCOWL devices may be incorporated into a machine tool and/or robot to facilitate performance of the laser application.

Although the present invention has been shown and described with respect to several preferred embodiments thereof, various changes, omissions and additions to the form and detail thereof, may be made therein, without departing from the spirit and scope of the invention.

What is claimed is:

1. A very large mode (VLM) slab-coupled optical waveguide laser (SCOWL) comprising:
    an upper waveguide region for guiding a laser mode, said upper waveguide region being positioned in the interior regions of the VLM SCOWL, wherein a plurality of trench structures lined with dielectric layers are formed in said upper waveguide region, said trench structures form ridge waveguide structures;
    a lower waveguide region for guiding said laser mode, said lower waveguide region being positioned in an area underneath said upper waveguide region;
    an active region positioned between said upper waveguide region and said lower waveguide region, said active region is arranged so etching into the VLM SCOWL is permitted to define the ridge waveguide structures leaving said active region unetched; and
    one or more mode control barrier layers positioned adjacent to said active region, said one or more mode control barrier layers controlling the vertical mode profile of the fundamental mode and preventing mode collapse of the fundamental laser mode and blocking carrier leakage from said active region, said one or more control barrier layers are chosen to have a lower index then said upper waveguide region and lower waveguide region, wherein the largest fraction of a single mode is positioned in said lower waveguide region, and wherein the height of said ridge waveguide structure is arranged so as to maintain the single mode.

2. The VLM SCOWL of claim 1 further comprising an upper cladding layer positioned near the upper waveguide region for confining said laser mode.

3. The VLM SCOWL of claim 1 further comprising a lower cladding layer positioned near said lower waveguide region for confining said laser mode.

4. The VLM SCOWL of claim 1, wherein said upper waveguide region comprises a p-type AlGaAs layer having a concentration of Al between 0% and 50%.

5. The VLM SCOWL of claim 1, wherein said lower waveguide region comprises an n-type AlGaAs layer having a concentration of Al between 0% and 50%.

6. The VLM SCOWL of claim 1, wherein said active region comprises quantum well layers, barrier layers, and bounding layers.

7. The VLM SCOWL of claim 1, wherein said upper waveguide region comprises a thickness between 0.30 μm and 2.0 μm.

8. The VLM SCOWL of claim 1, wherein said lower waveguide region comprises a thickness between 2.0 μm and 20 μm.

9. The VLM SCOWL of claim 1, wherein said upper waveguide region comprises a p-type dopant concentration between $1\times10^{15}$ and $1\times10^{18} cm^{-3}$.

10. The VLM SCOWL of claim 1, wherein said lower waveguide region comprises an n-type dopant concentration between $1\times10^{15}$ and $1\times10^{18} cm^{-3}$.

11. The VLM SCOWL of claim 1, wherein said one or more mode control barrier layers comprise a p-type or n-type AlGaAs layer having a concentration of Al between 0% and 50%.

12. The VLM SCOWL of claim 1, wherein said one or more mode control barrier layers comprise a thickness between 0.01 μm and 0.30 μm.

13. A method for forming a very large mode (VLM) a slab-coupled optical waveguide laser (SCOWL) comprising:
    forming an upper waveguide region for guiding a laser mode, said upper waveguide region being positioned in the interior regions of the VLM SCOWL, wherein a plurality of trench structures lined with dielectric layers are formed in said upper waveguide region, said trench structures form ridge waveguide structures;
    forming a lower waveguide region for guiding said laser mode, said lower waveguide region being positioned in an area underneath said upper waveguide region;
    positioning an active region between said upper waveguide region and said lower waveguide region;
    arranging said active region so etching into the VLM SCOWL is permitted to define the ridge structures leaving said active region unetched; and
    positioning one or more mode control barrier layers between said upper waveguide region and said lower waveguide region, said one or more mode control barrier layers preventing mode collapse of the laser mode and blocking carrier leakage from the active region, said one or more control barrier layers are chosen to have a lower index then said upper waveguide region and lower waveguide region, wherein the largest fraction of a single mode is positioned in said lower waveguide region, and wherein the height of said ridge waveguide structure is arranged so as to maintain the single mode.

14. The method of claim 13 further comprising an upper cladding layer positioned near the upper waveguide region for confining said laser mode.

15. The method of claim 13 further comprising a lower cladding layer positioned near said lower waveguide region for confining said laser mode.

16. The method of claim 13, wherein said upper waveguide region comprises a p-type AlGaAs layer having a concentration of Al between 0% and 50%.

17. The method of claim 13, wherein said lower waveguide region comprises an n-type AlGaAs layer having a concentration of Al between 0% and 50%.

18. The method of claim 13, wherein said active region comprises quantum well layers, barrier layers, and bounding layers.

19. The method of claim 13, wherein said upper waveguide region comprises a thickness between 0.30 μm and 2.0 μm.

20. The method of claim 13, wherein said lower waveguide region comprises a thickness between 2.0 pm and 20 μm.

21. The method of claim 13, wherein said upper waveguide region comprises a p-type dopant concentration between $1\times10^{15}$ and $1\times10^{18} cm^{-3}$.

22. The method of claim 13, wherein said lower waveguide region comprises an n-type dopant concentration between $1\times10^{15}$ and $1\times10^{18} cm^{-3}$.

23. The method of claim 13, wherein said one or more mode control barriers comprise a p-type or n-type AlGaAs layer having a concentration of Al between 0% and 50%.

24. The method of claim 13, wherein said one or more mode control barriers comprise a thickness between 0.01 μm and 0.30 μm.

* * * * *